(12) United States Patent
Jang et al.

(10) Patent No.: US 7,915,108 B2
(45) Date of Patent: Mar. 29, 2011

(54) METHOD FOR FABRICATING A SEMICONDUCTOR DEVICE WITH A FINFET

(75) Inventors: Se-Aug Jang, Ichon-shi (KR);
Hong-Seon Yang, Ichon-shi (KR);
Tae-Hang Ahn, Ichon-shi (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 221 days.

(21) Appl. No.: 11/646,288

(22) Filed: Dec. 28, 2006

(65) Prior Publication Data
US 2008/0081405 A1  Apr. 3, 2008

(30) Foreign Application Priority Data
Sep. 29, 2006  (KR) .................. 10-2006-0096463

(51) Int. Cl.
*H01L 21/336* (2006.01)
*H01L 31/062* (2006.01)

(52) U.S. Cl. ........ 438/197; 438/259; 438/270; 438/696; 438/706; 438/331

(58) Field of Classification Search .................. 438/197, 438/297
See application file for complete search history.

(56) References Cited

U.S. PATENT DOCUMENTS

| | | | |
|---|---|---|---|
| 6,770,516 B2 | 8/2004 | Wu et al. | |
| 6,884,733 B1 * | 4/2005 | Dakshina-Murthy et al. | 438/717 |
| 7,074,623 B2 | 7/2006 | Lochtefeld et al. | |
| 7,413,943 B2 * | 8/2008 | Kim et al. | 438/197 |
| 2004/0262687 A1 | 12/2004 | Jung et al. | |
| 2005/0170593 A1 | 8/2005 | Kang et al. | |
| 2005/0218434 A1 * | 10/2005 | Seo et al. | 257/288 |

FOREIGN PATENT DOCUMENTS

| | | |
|---|---|---|
| CN | 1714441 | 12/2005 |
| CN | 1770471 | 5/2006 |
| JP | 2005-019996 | 1/2005 |
| JP | 2005-333136 | 12/2005 |
| KR | 10-2005-0073099 A | 7/2005 |
| KR | 10-2005-0103810 A | 11/2005 |
| KR | 10-2006-0075074 A | 7/2006 |
| KR | 10-2006-0124387 A | 12/2006 |
| TW | 495852 | 7/2002 |
| TW | 574746 | 2/2004 |
| TW | 586164 | 5/2004 |

OTHER PUBLICATIONS

Notice of Allowance issued from the Chinese Patent Office on Dec. 16, 2009.
Notice of Allowance issued from the Taiwanese Intellectual Property Office on Jun. 22, 2010.

* cited by examiner

*Primary Examiner* — Thanh V Pham
*Assistant Examiner* — Mohammad Choudhry
(74) *Attorney, Agent, or Firm* — IP & T Group LLP

(57) ABSTRACT

A method for fabricating a semiconductor device includes forming a device isolation structure in a substrate to define active regions, forming a hard mask pattern to open a region defining an active region pattern and to cover the device isolation structure, forming the active region pattern by selectively recessing the device isolation structure formed in the opened region using the hard mask pattern as an etch barrier, removing the hard mask pattern, forming a gate insulation layer over the substrate to cover at least the active region pattern, and forming a gate electrode over the gate insulation layer to cover at least the active region pattern.

23 Claims, 16 Drawing Sheets

FIG. 1C
(PRIOR ART)
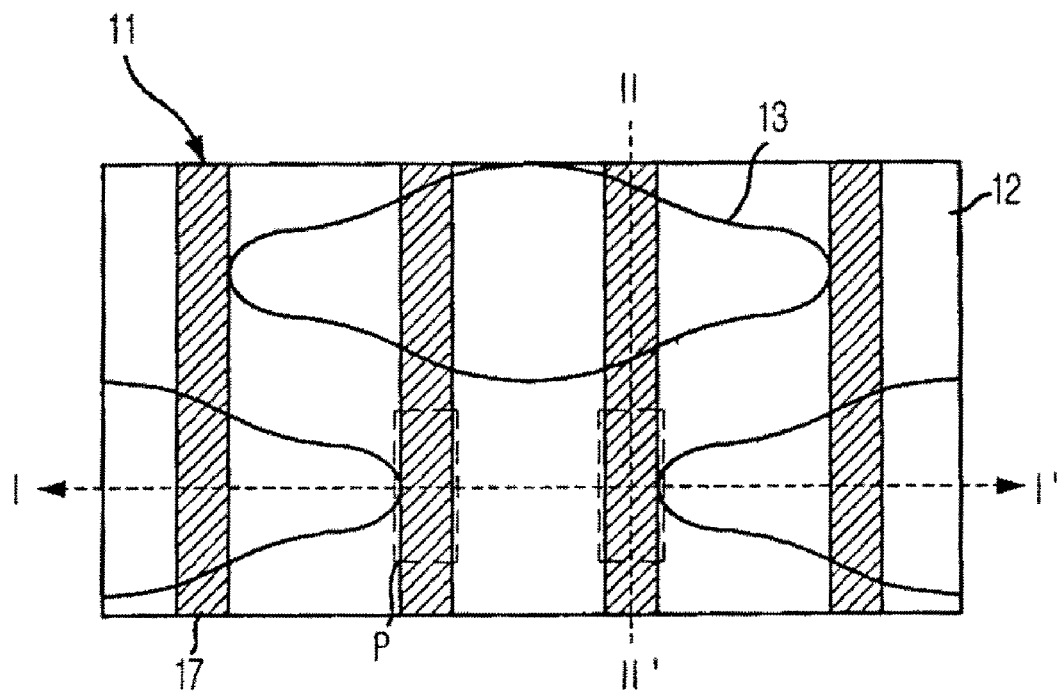
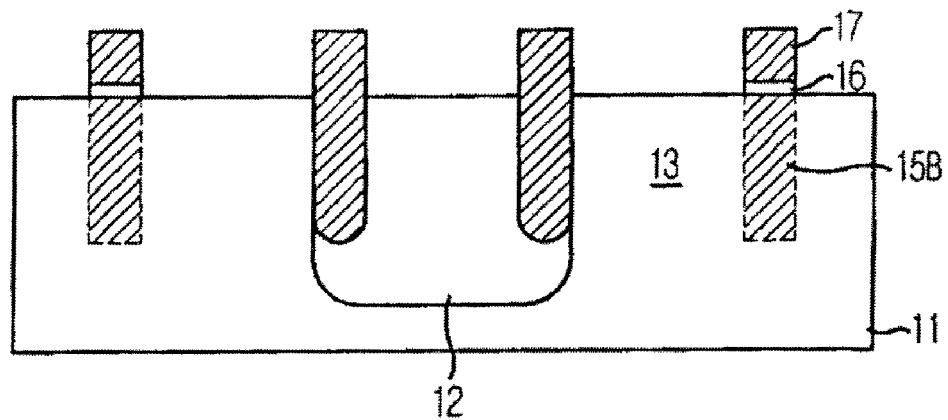

FIG. 3D
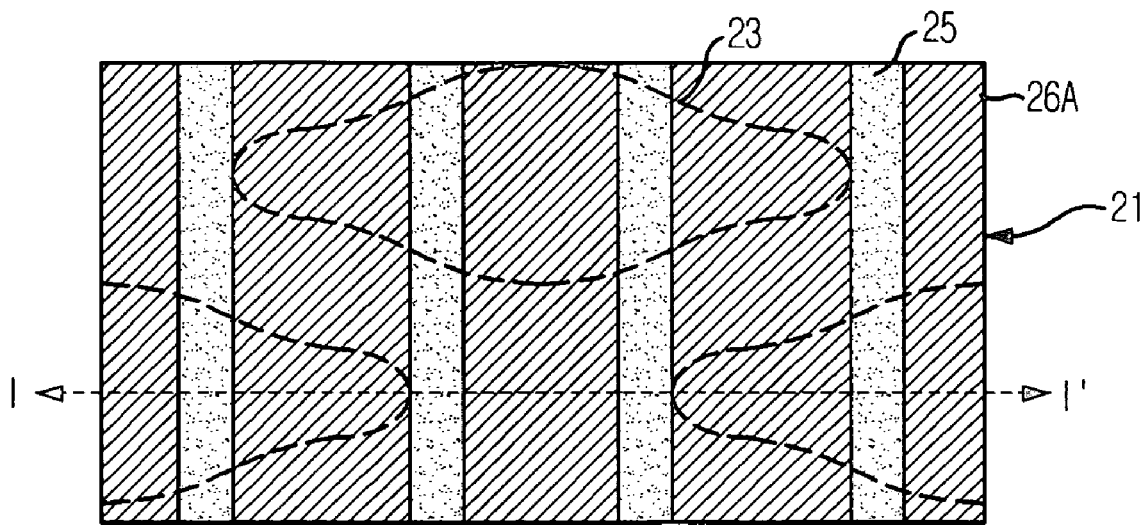
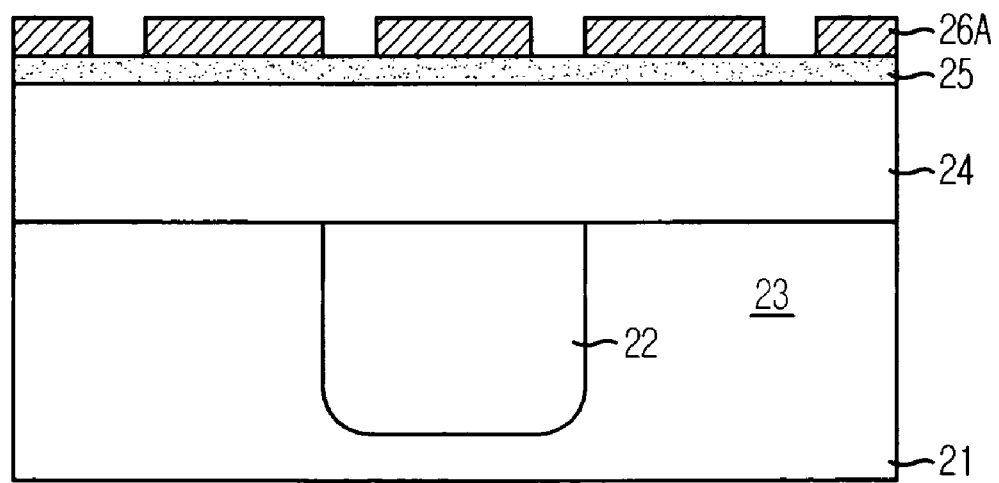

FIG. 3E
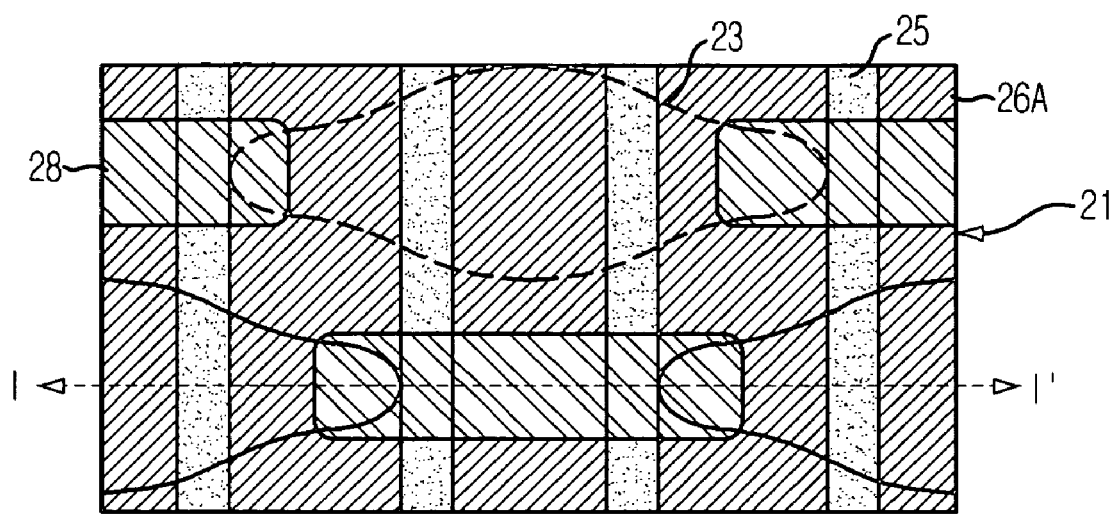
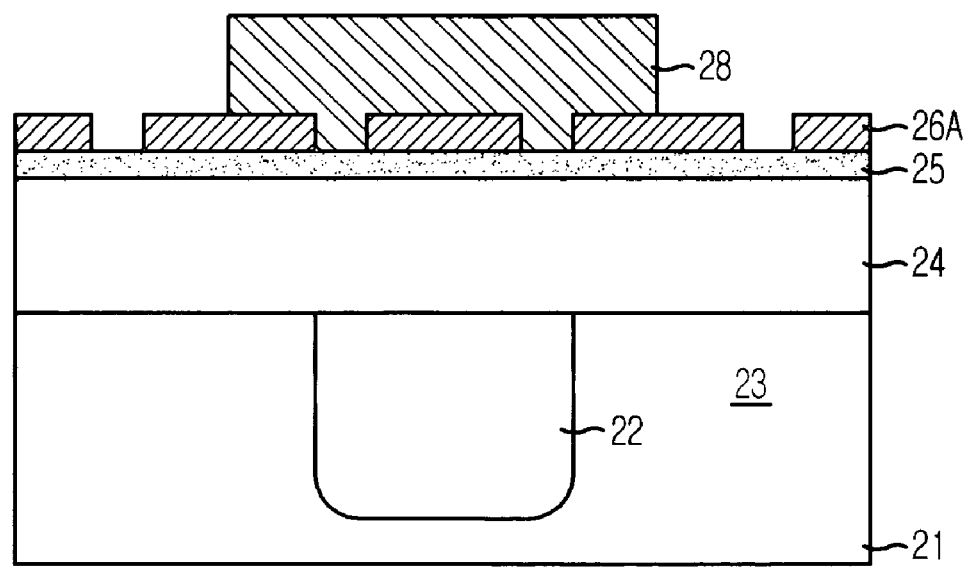

FIG. 3G
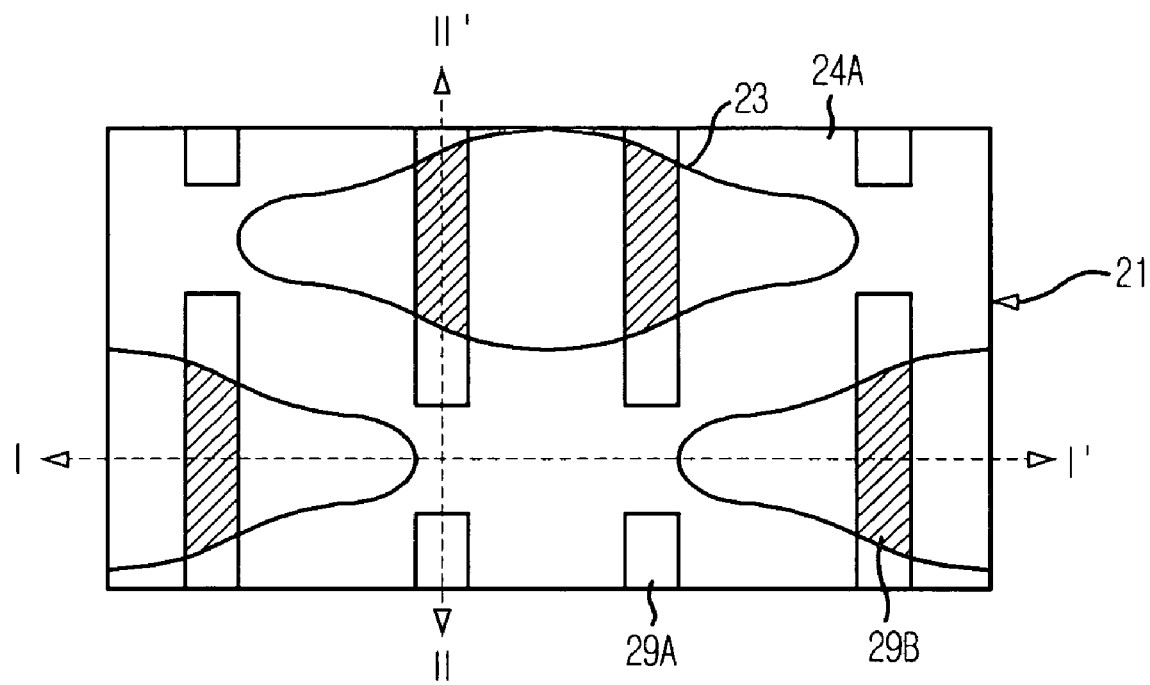
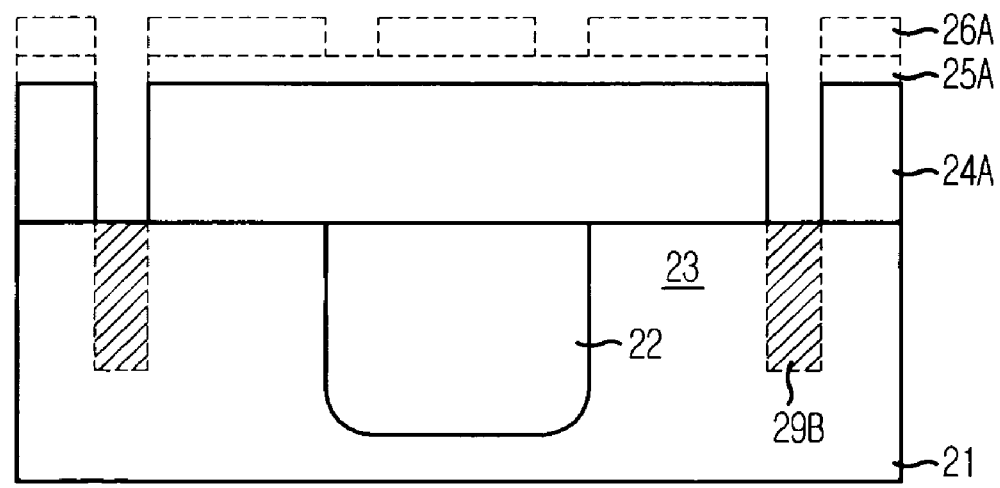

FIG. 3H
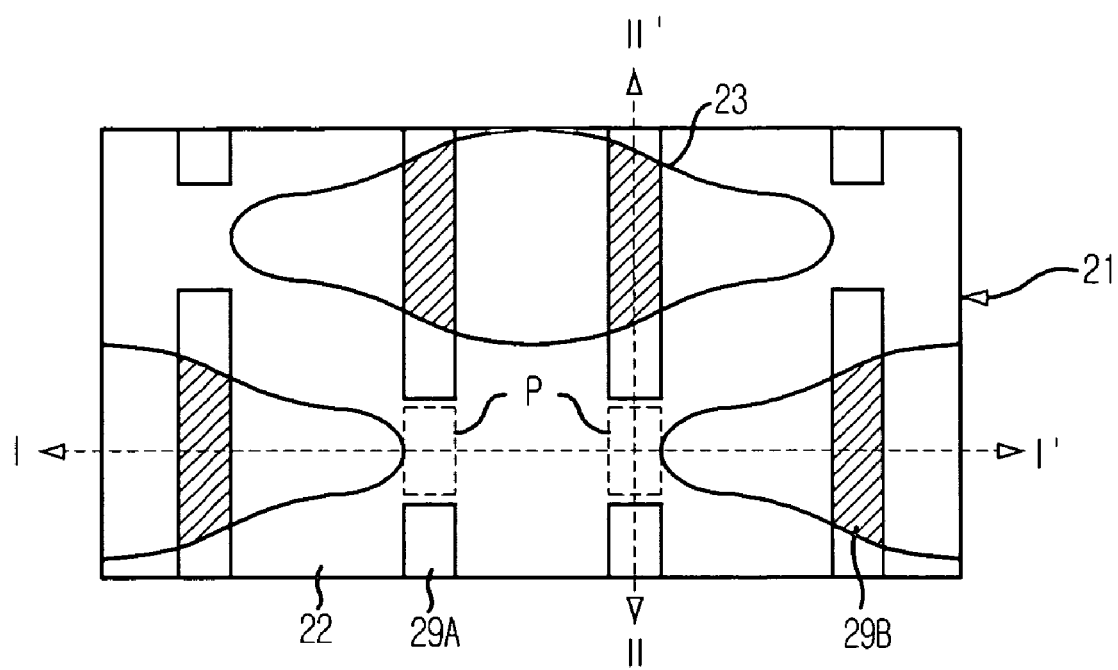
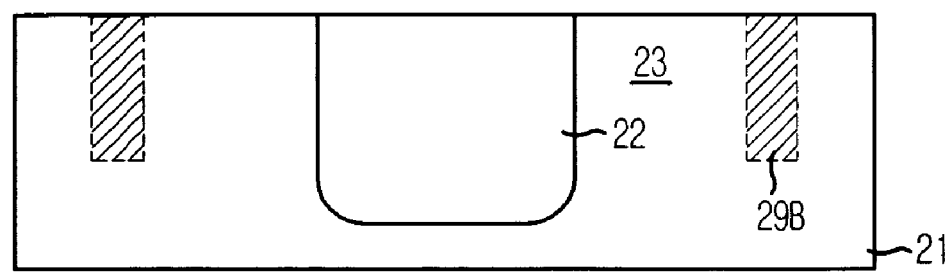

FIG. 31
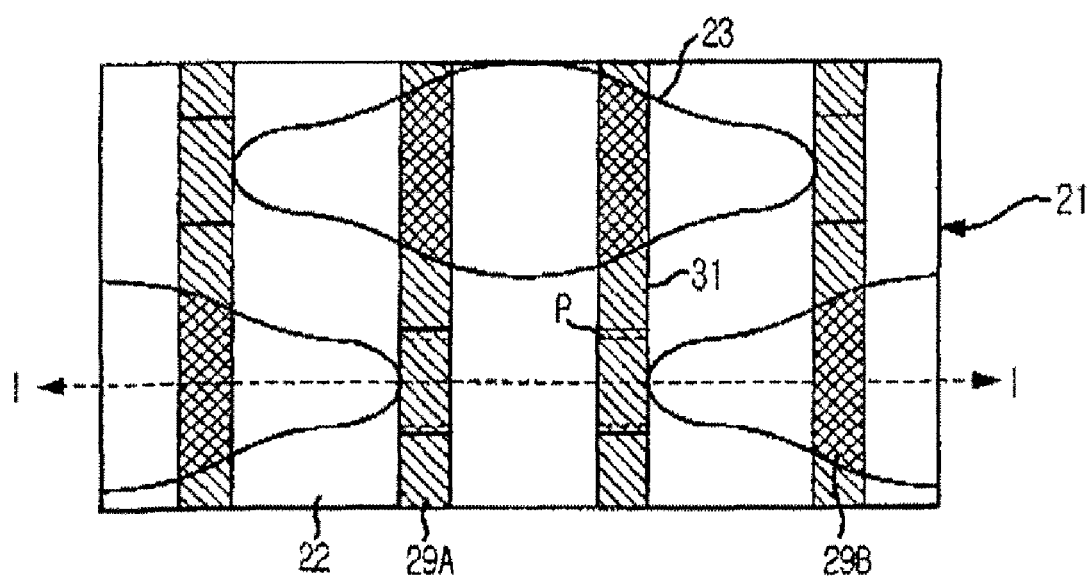
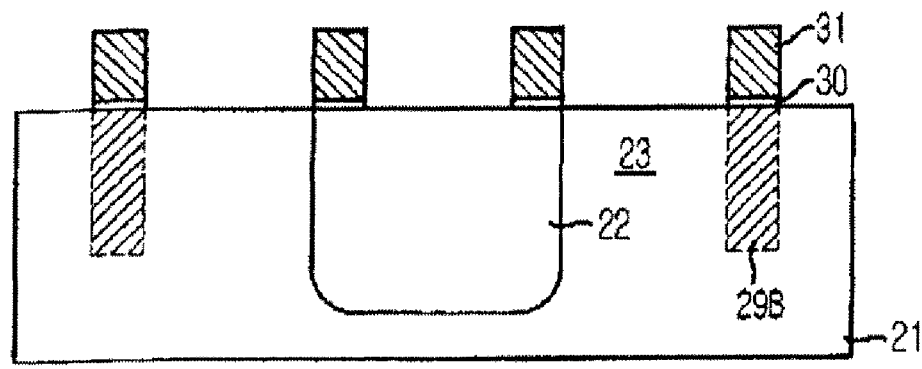

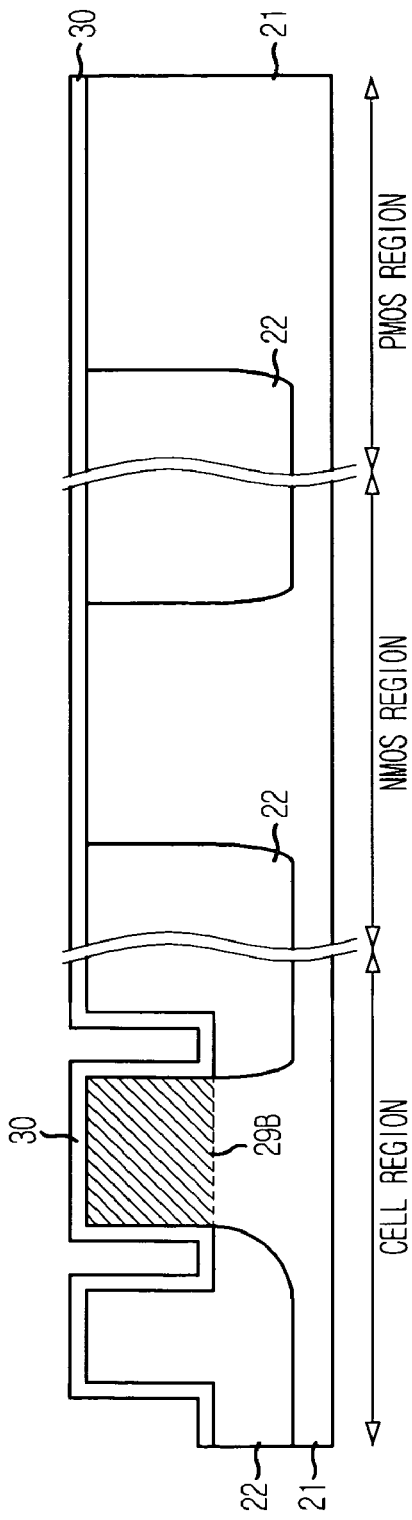
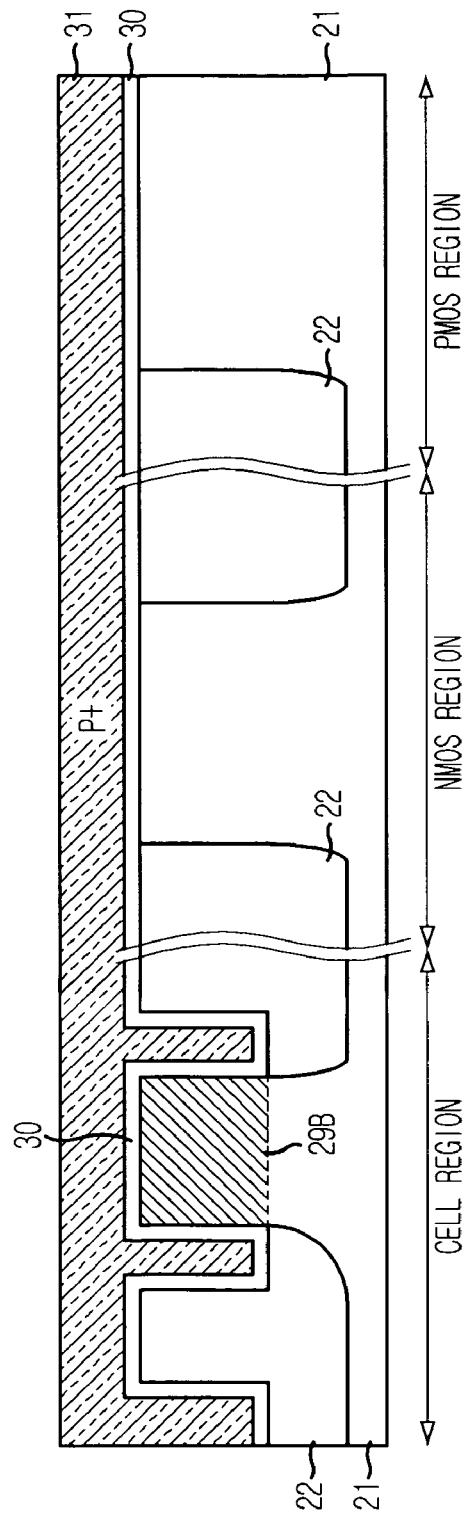

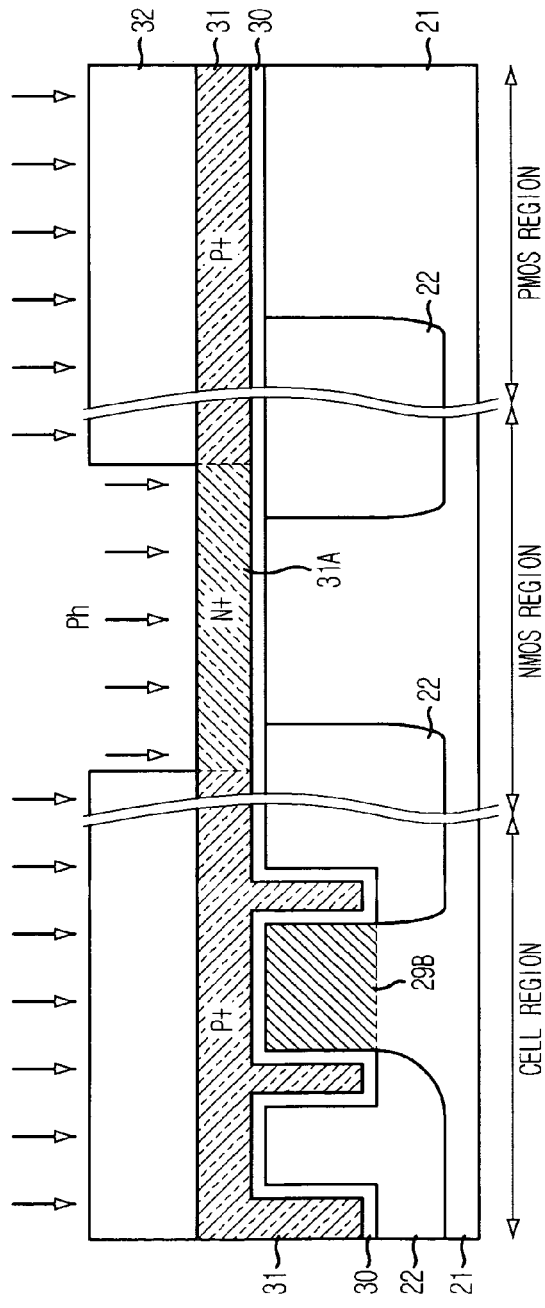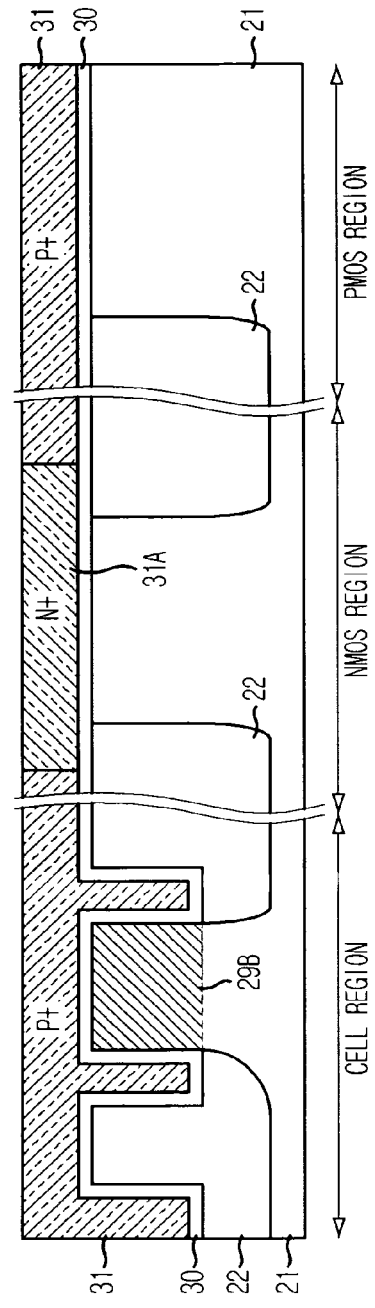

METHOD FOR FABRICATING A SEMICONDUCTOR DEVICE WITH A FINFET

RELATED APPLICATION

This application claims the benefit of priority to Korean patent application number 10-2006-0096463, filed on Sep. 29, 2006, which is incorporated herein by reference in its entirety.

BACKGROUND

1. Technical Field

The present invention generally relates to a method for fabricating a semiconductor device, and more specifically, to a method for fabricating a semiconductor device with a FinFET.

2. Description of the Related Art

Because semiconductor devices are highly integrated, two-dimensional transistor structures are limited in many aspects. Specifically, two-dimensional transistor structures cannot meet the current drivability requirements of high-speed semiconductor devices. To solve these limitations, a FinFET has been proposed. Because a FinFET comprises a three-sided channel, a FinFET has a very high current drivability and improved back bias dependency.

FIGS. 1A to 1C illustrate a method for fabricating a conventional FinFET. The top diagrams in each of FIGS. 1A to 1C illustrate plan view layouts of a FinFET and the bottom diagrams in each of FIGS. 1A to 1C illustrate sectional views taken along line I-I'.

Referring to FIG. 1A, a shallow trench isolation (STI) process is performed on a semiconductor substrate 11 to form a field oxide layer 12 defining an active region 13. Referring to FIG. 1B, a fin mask 14 with straight lines and a spacing pattern is then formed on semiconductor substrate 11. Field oxide layer 12 is then recessed (15A) to a predetermined thickness, using fin mask 14 as an etch barrier, to form a fin active region pattern 15B.

Referring to FIG. 1C, fin mask 14 is then removed and a gate insulation layer 16 is formed on fin active region pattern 15B, and subsequently, a gate electrode 17 is formed on gate insulation layer 16. A passing gate is then formed in a region referenced by symbol "P" in FIG. 1C. The passing gate is a gate that is formed in a region where no channel is formed. The passing gate can have an influence on a storage node SN of a DRAM, and as such, degrade device characteristics like data retention time. Therefore, it is preferable to not etch field oxide layer 12 formed in region P during fabrication of a FinFET.

FIG. 2A illustrates a sectional view taken along line II-II' of FIG. 1C. As illustrated, three sides of fin active region pattern 15B are used as a channel. However, because the three sides of fin active region pattern 15B, acting as a channel, are easily opened, it is difficult to increase the threshold voltage above a predetermined level.

Accordingly, in order to increase the threshold voltage, side doping 18 may be performed on the sidewalls of fin active region pattern 15B using an ion implantation process under conditions of $BF_2$, 60 keV, $2.0 \times 10^{13}$ atoms/cm$^3$, and 30° tilt; and top doping 19 may be performed on the top of fin active region pattern 15B under conditions of $BF_2$, 20 keV, $0$-$2.0 \times 10^{13}$ atoms/cm$^3$, and 7° tilt, thereby forming a phosphorous-doped polysilicon gate electrode. Meanwhile, a heavily doped N-type (N$^+$) polysilicon gate electrode is used in a cell region. For example, an in-situ phosphorous-doped polysilicon gate electrode can be used as the N$^+$ polysilicon gate electrode.

FIG. 2B illustrates the measurement results of threshold voltages of cell transistors in 1,000 cell arrays. Specifically, FIG. 2B illustrates cell threshold voltages (1K cell Vtsat) with respect to top dose during top doping. Even though the dose is split during the top doping, it is still difficult to increase the threshold voltage above about 0.5 V. Therefore, conventional FinFETs cannot be used as cell transistors of a DRAM requiring a high threshold voltage of approximately 0.8 V or more. If the threshold voltage cannot be increased above a predetermined level, off leakage characteristics may be greatly degraded in a DRAM.

SUMMARY

Accordingly, embodiments consistent with the present invention provide a method for fabricating a FinFET that can prevent a loss of a field oxide layer formed in a region influencing a storage node.

Other embodiments consistent with the present invention provide a method for fabricating a FinFET with a current drivability without degrading off leakage characteristics even though three sides of a fin active region pattern are easily opened.

Consistent with an embodiment of the present invention, there is provided a method for fabricating a semiconductor device, the method including: forming a device isolation structure in a substrate to define active regions; forming a hard mask pattern to open a region defining an active region pattern and to cover the device isolation structure; forming the active region pattern by selectively recessing the device isolation structure formed in the opened region using the hard mask pattern as an etch barrier; removing the hard mask pattern; forming a gate insulation layer over the substrate to cover at least the active region pattern; and forming a gate electrode over the gate insulation layer to cover at least the active region pattern.

BRIEF DESCRIPTION OF THE DRAWINGS

FIGS. 1A to 1C illustrate a method for fabricating a conventional FinFET.

FIGS. 3A to 3I illustrate a method for fabricating a FinFET consistent with an embodiment of the present invention.

FIGS. 5A to 5D illustrate a method for fabricating a semiconductor device with a FinFET consistent with an embodiment of the present invention.

DETAILED DESCRIPTION

An embodiment consistent with the present invention provides a method for fabricating a semiconductor device with a FinFET. The method can prevent a loss of a field oxide layer formed in a region influencing a storage node and secure a high current drivability without degrading off leakage characteristics even though three sides of a fin active region pattern are easily opened.

Figure 1A:
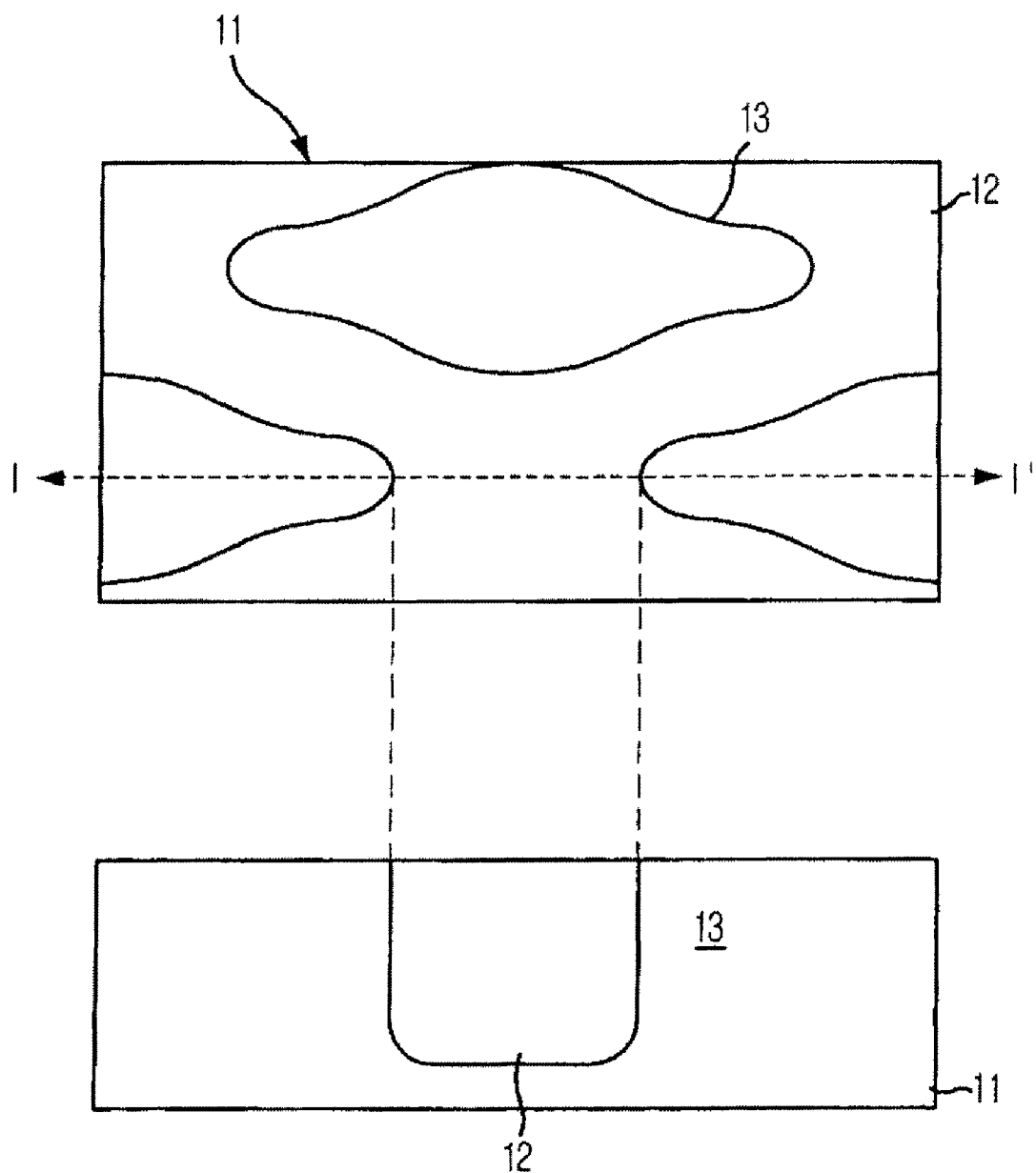
Figure 1B:
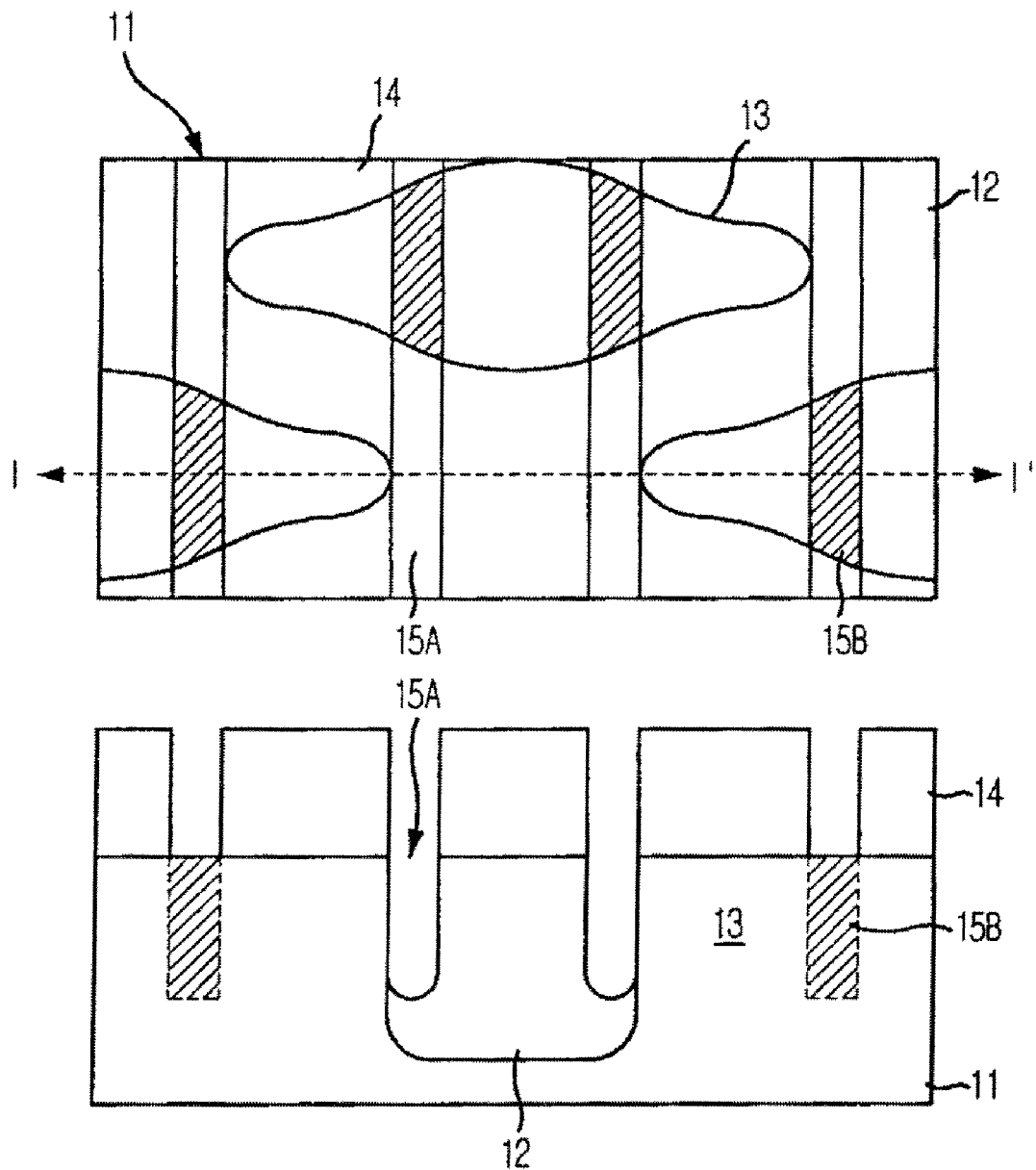
Figure 2A:
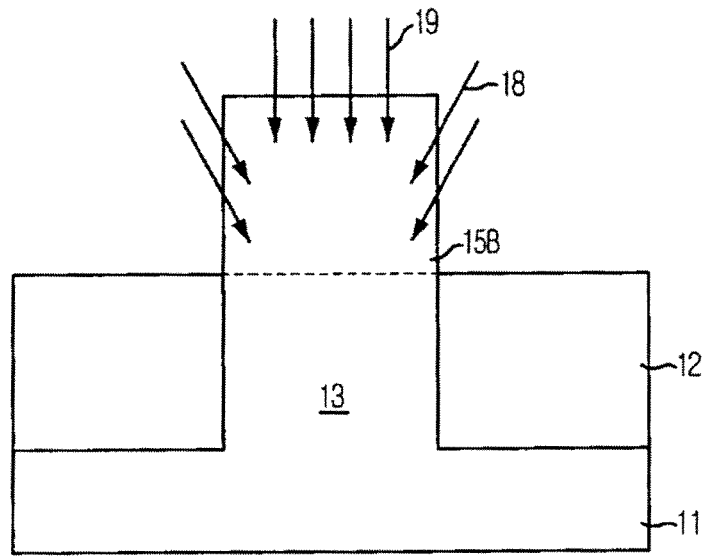
FIG. 2A illustrates a cross-sectional view taken along line II-II' of FIG. 1C.
Figure 2B:
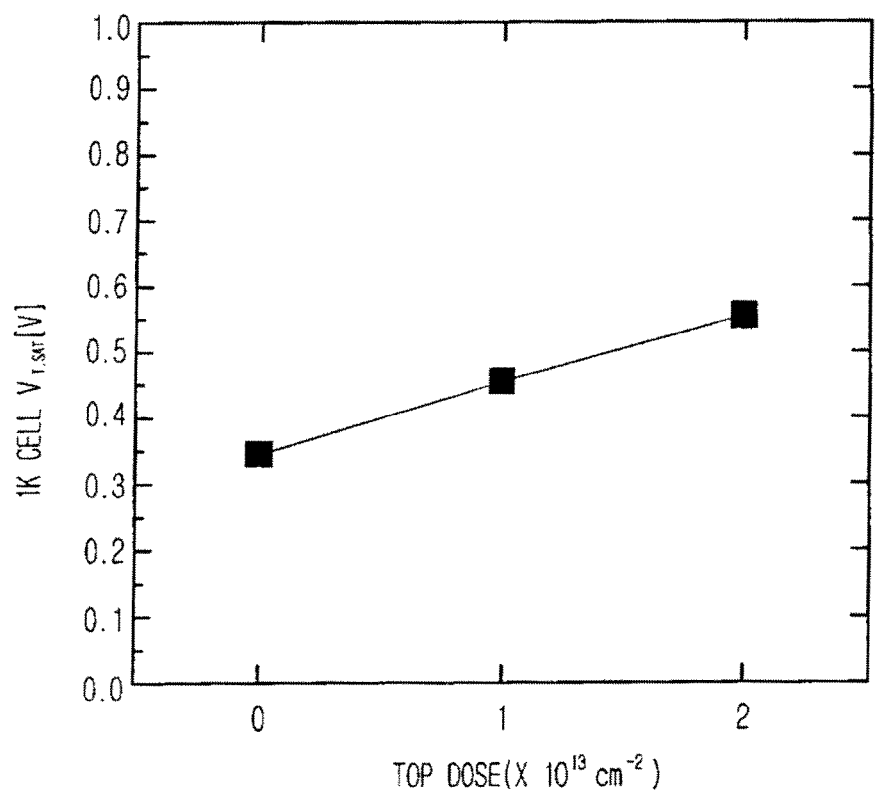
FIG. 2B illustrates the measurement results of threshold voltages of cell transistors in 1,000 cell arrays.
Figure 3A:
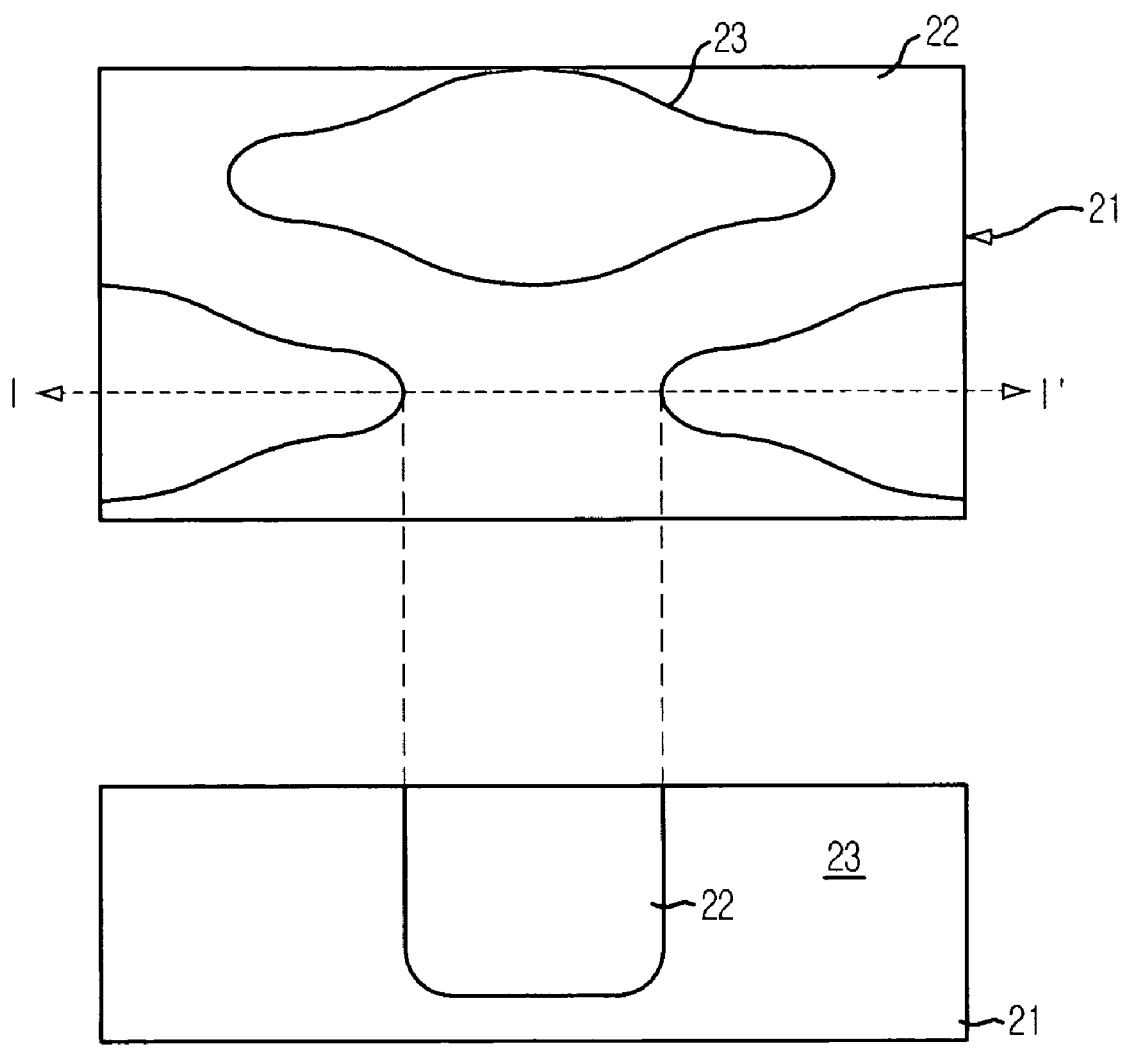

FIGS. 3A to 3I illustrate a method for fabricating a FinFET consistent with an embodiment of the present invention. In FIGS. 3A and 3I, top diagrams illustrate plan view layouts of the FinFET and bottom diagrams illustrate cross-sectional views taken along lines I-I'.

Referring to FIG. 3A, a shallow trench isolation (STI) process is performed over a semiconductor substrate 21 to form a field oxide layer 22 defining an active region 23. The field oxide layer 22 functions as a device isolation structure. Active region 23 has an island-shaped pattern with a major axis and a minor axis. Line I-I' runs along the major axis direction of active region 23. A recess gate will be formed along the minor axis direction of active region 23.

Figure 3B:
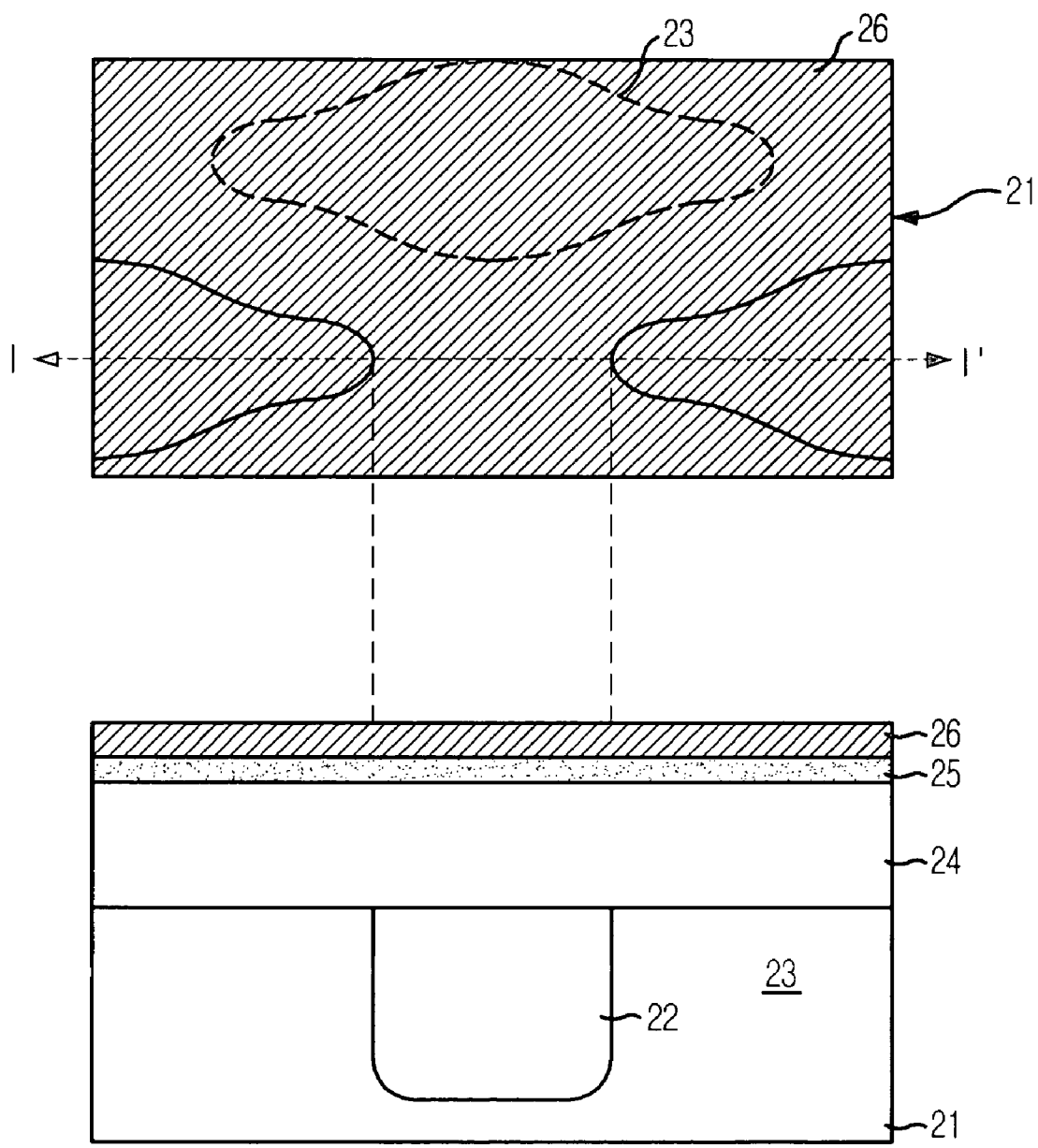

Referring to FIG. 3B, a carbon based hard mask 24 is formed over semiconductor substrate 21. Carbon based hard mask 24 may be formed of an amorphous carbon layer and may have a thickness ranging from approximately 1,000 Å to approximately 2,000 Å. A silicon oxide layer ($SiO_2$) having a thickness of less than approximately 100 Å may be formed under carbon based hard mask 24. Carbon based hard mask 24 will be used as a hard mask in etching the field oxide layer in order to form a fin active region pattern.

An oxide based hard mask 25 is then formed over carbon based hard mask 24. Oxide based hard mask 25 may be formed of a silicon oxynitride layer (SiON) or a silicon oxide layer and may have a thickness ranging from approximately 200 Å to approximately 600 Å. A silicon based hard mask 26 is then formed over oxide based hard mask 25. Silicon based hard mask 26 may be formed of an amorphous silicon or a polysilicon and may have a thickness ranging from approximately 200 Å to approximately 400 Å. Oxide based hard mask 25 and silicon based hard mask 26 are used as a hard mask to etch carbon based hard mask 24. Consistent with an embodiment of the present invention, the hard mask for the FinFET has a triple structure hard mask pattern.

Figure 3C:
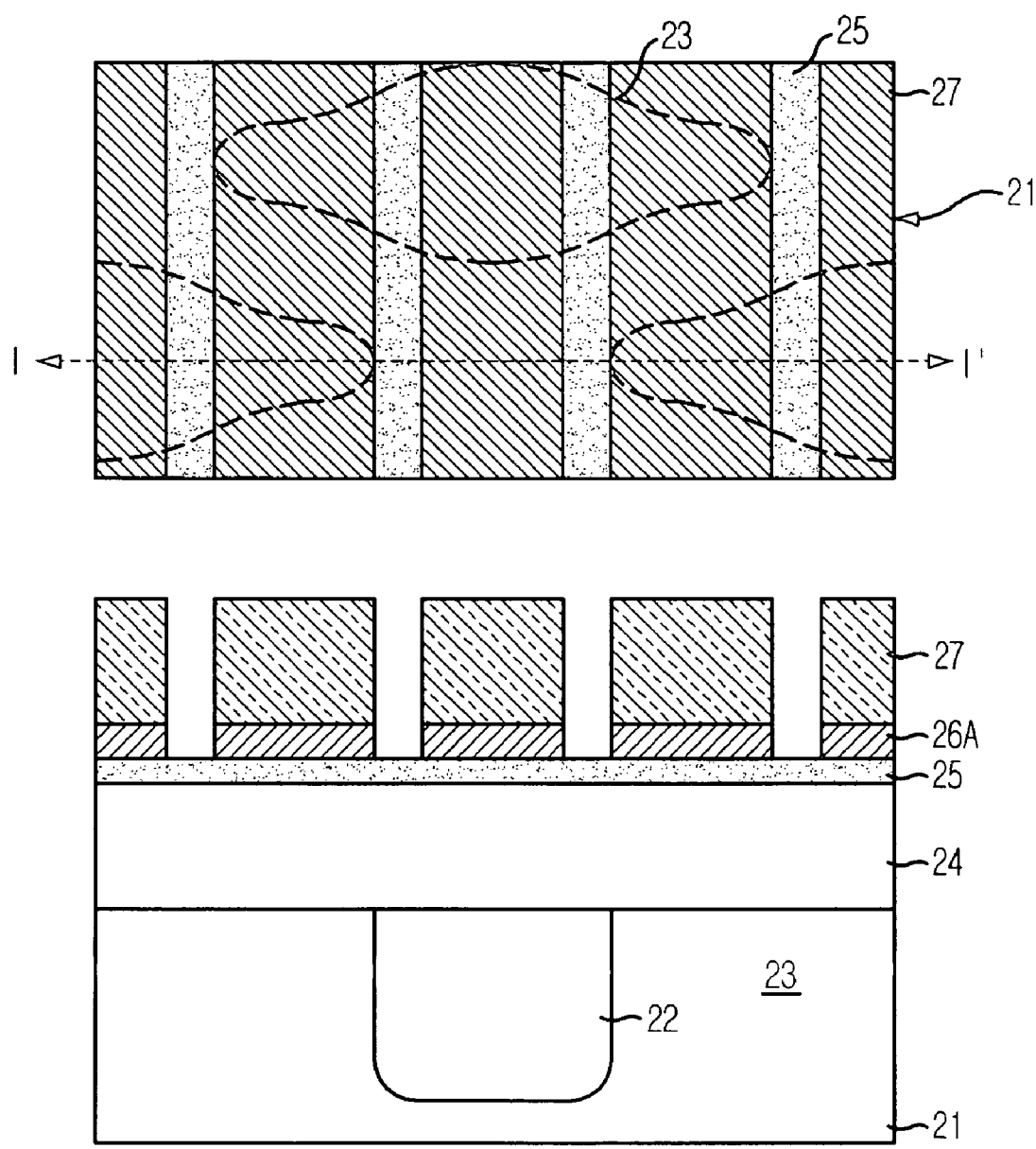

Referring to FIG. 3C, a photoresist is deposited, exposed, and developed to form a first photoresist pattern 27. First photoresist pattern 27 may be formed to have straight lines with a spacing pattern therebetween. Silicon based hard mask 26 is then selectively dry-etched using first photoresist pattern 27 to form a silicon based hard mark pattern 26A. Silicon based hard mask 26 is easily patterned because of its dry etch selectivity with respect to oxide based hard mask 25. Silicon based hard mask pattern 26A may be formed to have straight lines with a spacing pattern therebetween similar to that of first photoresist pattern 27. The surface of oxide based hard mask 25 is thereby partially exposed by silicon based hard mask pattern 26A. Referring to FIG. 3D, first photoresist pattern 27 is removed to expose silicon based hard mask pattern 26A.

Referring to FIG. 3E, a photoresist is deposited, exposed, and developed to form a second photoresist pattern 28. Second photoresist pattern 28 covers at least a passing gate region of field oxide layer 22. That is, second photoresist pattern 28 is an island-shaped pattern covering facing ends of neighboring active regions 23 along the major axis direction and the field oxide layer 22 formed between neighboring active regions 23.

More specifically, second photoresist pattern 28 covers field oxide layer 22 formed between adjacent active regions 23, and both ends of second photoresist pattern 28 partially overlap the facing ends of neighboring active regions 23. Consequently, second photoresist pattern 28 partially exposes the upper portion of active region 23, in which the fin active region pattern will be formed, and field oxide layer 22 adjacent to active region 23. In addition, second photoresist pattern 28 covers a portion of the passing gate region in the active region where the fin active region pattern will be formed.

Figure 3F:
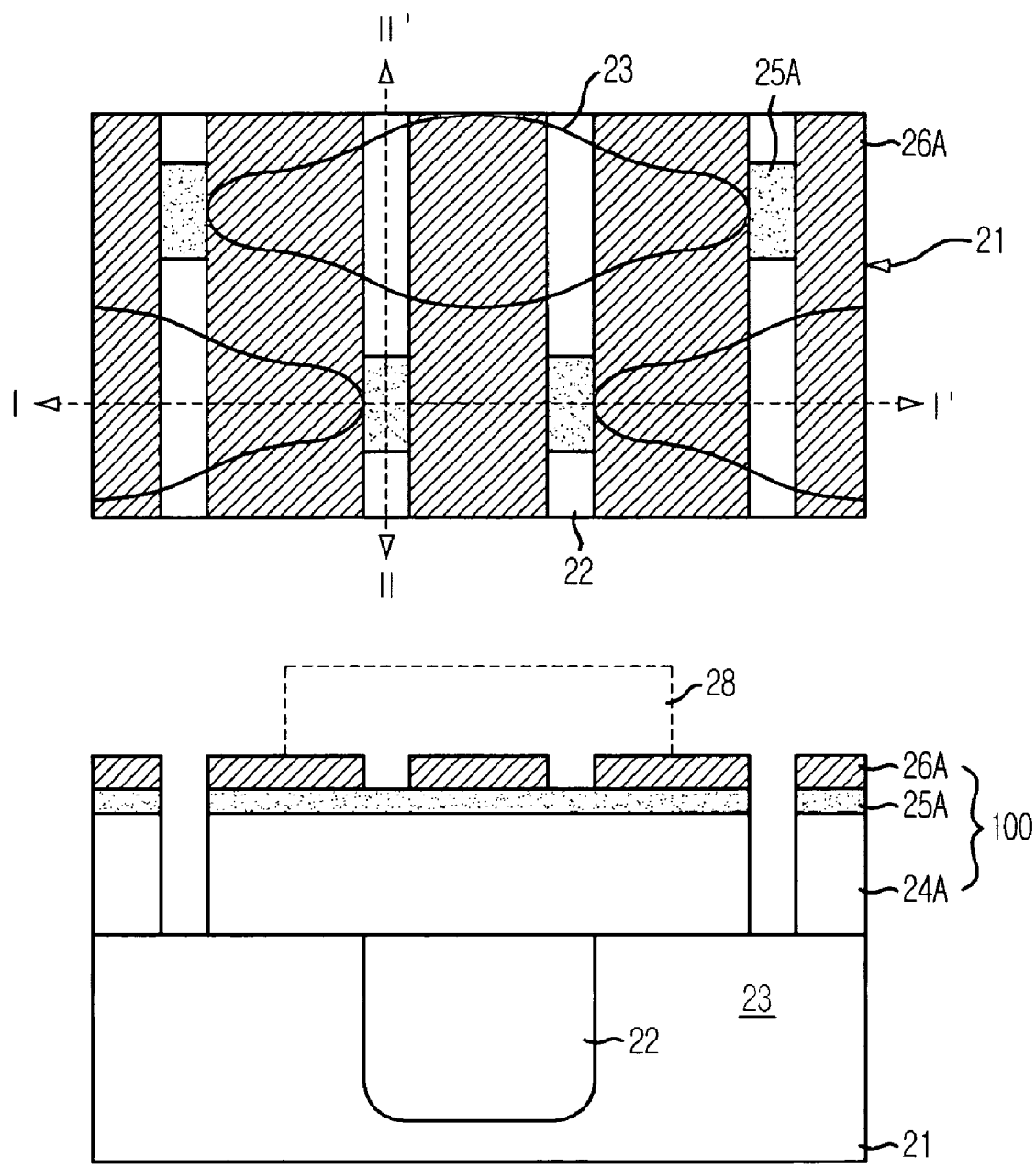

Referring to FIG. 3F, oxide based hard mask 25, exposed by silicon based hard mask 26A, is dry-etched using second photoresist pattern 28 as an etch mask. Carbon based hard mask 24 formed under oxide based hard mask 25 is subsequently dry-etched. After carbon based hard mask 24 is dry-etched, second photoresist pattern 28 is etched and removed.

When the above-described etching processes are completed, a stacked hard mask pattern 100 is formed over active region 23. Stacked hard mask pattern 100 includes carbon based hard mask pattern 24A, oxide based hard mask pattern 25A, and silicon based hard mask pattern 26A. Carbon based hard mask pattern 24A of stacked hard mask pattern 100 opens the region where the fin active region pattern will be formed. However, carbon based hard mask pattern 24A and oxide based hard mask pattern 25A of stacked hard mask pattern 100 remain in the passing gate region.

Referring to FIG. 3G, field oxide layer 22, disposed in the opened region, is selectively recessed (29A) by a dry etching process using stacked hard mask pattern 100 as an etch barrier. Thus, the active region is protruded to form an active region pattern 29B. The active region pattern 29B is a fin active region pattern, and is referred to as the fin active region pattern 29B hereinafter. When field oxide layer 22 is etched, silicon based hard mask pattern 26A and oxide based hard mask pattern 25A are also etched and removed. The removed silicon based hard mask pattern 26A and oxide based hard mask pattern 25A are indicated by dotted lines in FIG. 3G.

After fin active region pattern 29B is formed, only carbon based hard mask pattern 24A remains. This means that carbon based hard mask pattern 24A is used as a hard mask in forming fin active region pattern 29B. In addition, carbon based hard mask pattern 24A also remains over the passing gate region. Hence, carbon mask pattern 24A can prevent the loss of the field oxide layer corresponding to the passing gate region. Because of the remaining carbon based hard mask pattern 24A, a recess 29A is formed only in the field oxide layer adjacent to fin active region pattern 29B (see FIG. 4B).

Referring to FIG. 3H, carbon based hard mask pattern 24A is removed. Carbon based hard mask pattern 24A may be removed by a stripping process using oxygen plasma.

Referring to FIG. 3I, a gate insulation layer 30 is formed over fin active region pattern 29B. Gate insulation layer 30 may be formed using a nitridized insulation layer in order to prevent penetration of boron doped into polysilicon. Gate insulation layer 30 may be formed of SiON or HfSiON. A gate electrode 31 is then formed over gate insulation layer 30. Gate electrode 31 may be formed of an in-situ boron-doped polysilicon (hereinafter referred to as a p-type polysilicon). The concentration of boron may range from approximately $10^{19}$ atoms/$cm^3$ to approximately $10^{21}$ atoms/$cm^3$, and the deposition thickness of polysilicon may range from approximately 500 Å to approximately 1,500 Å. If gate electrode 31 of the FinFET is formed of the p-type polysilicon, the concentration of boron is uniform at all locations. Therefore, a threshold voltage is increased without degrading off leakage characteristics.

Figure 4A:
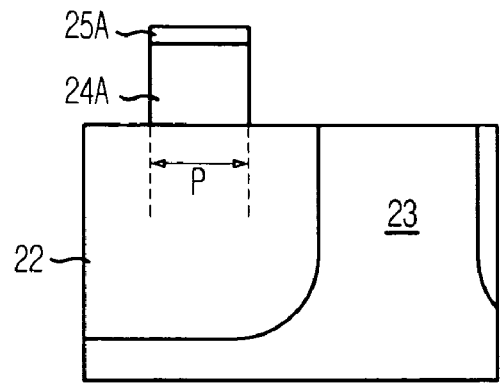
FIG. 4A illustrates a cross-sectional view taken along line II-II' of FIG. 3F.

FIG. 4A illustrates a cross-sectional view taken along line II-II' of FIG. 3F. FIG. 4A shows that carbon based hard mask pattern 24A and oxide based hard mask pattern 25A are formed over passing gate region P of field oxide layer 22.

Figure 4B:
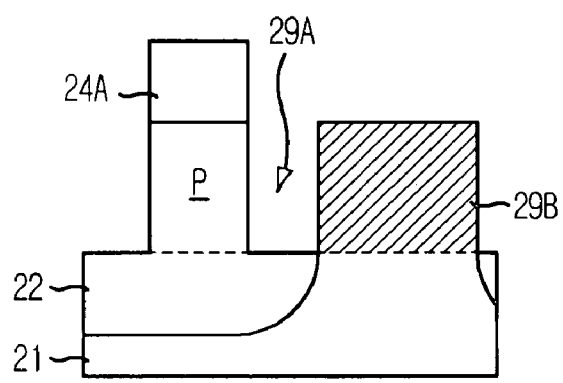
FIG. 4B illustrates a cross-sectional view taken along line II-II' of FIG. 3G.

FIG. 4B illustrates a cross-sectional view taken along line II-II' of FIG. 3G. Referring to FIG. 4B, carbon based hard mask pattern 24A is formed over passing gate region P of field oxide layer 22. Thus, recess 29A is formed only in the field oxide layer 22 adjacent to the fin active region pattern 29B. The remaining region of the field oxide layer 22 covered by carbon based hard mask pattern 24A is protected from loss. A part of the field oxide layer covered by carbon based hard mask pattern 24A influences the active region where a storage node will be connected.

Figure 4C:
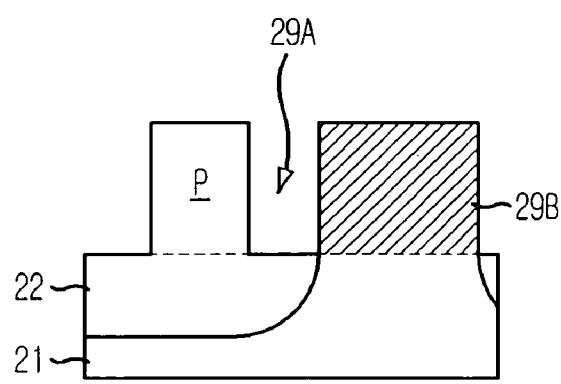
FIG. 4C illustrates a cross-sectional view taken along line II-II' of FIG. 3H.

FIG. 4C illustrates a cross-sectional view taken along line II-II' of FIG. 3H. Referring to FIGS. 3H and 4C, when carbon based hard mask pattern 24A is stripped, fin active region pattern 29B is formed in active region 23. In addition, no etching loss occurs in passing gate region P of field oxide layer 22, and recess 29A is formed only in the region adjacent to fin active region pattern 29B. In forming the fin active region pattern, the field oxide layer is partially etched, thus preventing the influence on the active region to which the storage node will be connected.

FIGS. 5A to 5D illustrate a method for fabricating a semiconductor device with the FinFET consistent with an embodiment of the present invention. Semiconductor substrate 21 defines a cell region and a peripheral region. The cell region is an NMOS region and the peripheral region is divided into an NMOS region and a PMOS region.

Referring to FIG. 5A, a gate insulation layer 30 is formed over a semiconductor substrate 21 with a fin active region pattern 29B. Prior to forming gate insulation layer 30, fin active region pattern 29B is formed in the cell region when the peripheral region has a two-dimensional planar structure. Fin active region pattern 29B is formed by the processes illustrated in FIGS. 3A to 3H. Gate insulation layer 30 may be formed of a nitridized insulation layer in order to prevent penetration of boron doped into polysilicon. Gate insulation layer 30 may be formed of SiON or HfSiON.

Referring to FIG. 5B, heavily-doped P-type (P$^+$) polysilicon 31 for a gate electrode is formed over gate insulation layer 30. The P-type polysilicon 31 may be an in-situ boron-doped polysilicon. The concentration of boron may range from approximately $10^{19}$ atoms/cm$^3$ to approximately $10^{21}$ atoms/cm$^3$, and the deposition thickness of polysilicon may range from approximately 500 Å to approximately 1,500 Å.

Referring to FIG. 5C, phosphorous ions Ph are implanted into P-type polysilicon 31 of the NMOS region by using an ion implantation barrier 32 covering the cell region and the PMOS region. The dose of phosphorous ions Ph is adjusted to change P-type polysilicon 31 to an N-type polysilicon. For example, when the boron concentration within the P-type polysilicon is $10^{20}$ atoms/cm$^3$, the P-type polysilicon is changed to a heavily-doped N-type (N$^+$) polysilicon 31A by implanting phosphorous ions at a dose of $10^{16}$ atoms/cm$^3$. Sides of ion implantation barrier 32 may extend over field oxide layer 22. Ion implantation barrier 32 may be a photoresist pattern. Referring to FIG. 5D, ion implantation barrier 32 is removed.

Because the phosphorous ions are implanted only into the NMOS region, the heavily-doped P-type (P$^+$) polysilicon 31 remains in the cell region and the PMOS region while the heavily-doped N-type (N$^+$) polysilicon 31A is formed in the NMOS region. Consequently, the FinFET of the cell region and the gate electrode of the PMOS region are formed of the P-type polysilicon 31 doped with the P-type impurity, and the gate electrode of the NMOS region is formed of the N-type polysilicon 31A doped with the N-type impurity.

As described above, when P-type polysilicon 31 is used as the gate electrode of the FinFET in the cell region, the boron concentration is uniform at all locations. Thus, the threshold voltage increases without degrading the off leakage characteristics.

In etching the field oxide layer using the fin mask, the field oxide layer is partially etched, suppressing the influence on the active region to which the storage node will be connected and improving the device characteristics such as data retention time. Moreover, because the P-type polysilicon in which P-type impurity, e.g., boron, is doped uniformly at all locations is used as the gate electrode of the FinFET, the current drivability can be improved without degradation of the off leakage characteristics.

While the present invention has been described with respect to several embodiments, it will be apparent to those skilled in the art that various changes and modifications may be made without departing from the spirit and scope of the invention as defined in the following claims.

What is claimed is:

1. A method for fabricating a semiconductor device, the method comprising:
   forming a device isolation structure filled with oxide-based material in a substrate to form active regions;
   forming a hard mask layer patterned over the substrate having the device isolation structure to expose a first region defining an active region pattern in the active region and a second region in the device isolation structure to be adjacent to the active region pattern and to cover portions of the device isolation structure disposed between the neighboring active regions and between the second region, where in the first region, the second region and the portions of the device isolation structure are aligned in a line shape, and the hard mask layer covers the substrate except for the first region, the second region and the portions of devices isolation structure;
   the hard mask layer further comprising:
      forming a first mask layer patterned over the substrate having the device isolation structure to expose the first region;
      forming a second mask layer over the first mask layer;
      forming a third mask pattern, having straight lines with a space separating each of the straight lines, over the second mask layer;
      forming a fourth mask pattern, covering an area over the device isolation structure and between neighboring active regions, over the third mask pattern; and
      recessing exposed portions of the first and second mask layers using the fourth mask pattern and third mask pattern as etching barriers to expose portions of the oxide-based material;
   recessing the exposed portions of the oxide based material using the first mask layer as etch barrier to form an active region pattern in the active region;
   removing the first mask layer;
   forming a gate insulation layer over the substrate to cover at least the active region pattern; and
   forming a gate electrode over the gate insulation layer to cover at least the active region pattern.

2. The method of claim 1, wherein the active region pattern comprises a fin active region pattern.

3. The method of claim 1, wherein the fourth mask pattern is formed to cover facing ends of the neighboring active regions.

4. The method of claim 3, wherein
   the first mask layer is a carbon based hard mask, the second mask layer is an oxide based hard mask, and the third mask pattern is a silicon based hard mask.

5. The method of claim 4, wherein the forming of the third mask pattern comprises:
   forming a silicon based hard mask over the oxide based hard mask;
   forming a recess mask over the silicon based hard mask, the recess mask having a pattern formed to have straight lines with a spacing pattern therebetween;
   etching the silicon based hard mask using the recess mask as an etch barrier to form the silicon based hard mask pattern; and
   removing the recess mask.

6. The method of claim 4, wherein the carbon based hard mask includes an amorphous carbon layer.

7. The method of claim 6, wherein the carbon based hard mask is formed to a thickness ranging from approximately 1,000 Å to approximately 2,000 Å.

8. The method of claim 4, further comprising:
   forming an oxide layer between the carbon based hard mask and the substrate to a thickness of approximately 100 Å or less.

9. The method of claim 4, wherein the oxide based hard mask is formed using a silicon nitride layer or a silicon oxide layer.

10. The method of claim 9, wherein the oxide based hard mask is formed to a thickness ranging from approximately 200 Å to approximately 600 Å.

11. The method of claim 4, wherein the silicon based hard mask includes an amorphous silicon or a polysilicon.

12. The method of claim 11, wherein the silicon based hard mask is formed to a thickness ranging from approximately 200 Å to approximately 400 Å.

13. The method of claim 1, wherein the gate insulation layer includes a nitridized insulation layer.

14. The method of claim 13, wherein the nitridized insulation layer includes SiON or HfSiON.

15. The method of claim 1, wherein the gate electrode includes polysilicon doped with P-type impurity.

16. The method of claim 15, wherein the P-type impurity is boron.

17. The method of claim 16, wherein a concentration of the boron ranges from approximately $10^{19}$ atoms/cm$^3$ to approximately $10^{21}$ atoms/cm$^3$.

18. The method of claim 15 wherein the polysilicon is formed to a thickness ranging from approximately 500 Å to 1,500 Å.

19. The method of claim 1, wherein the substrate defines a cell region where a fin active region pattern is formed and a peripheral region where a planar active region is formed, and the forming of the gate electrode comprises:
   forming P-type polysilicon doped with P-type impurity; and
   doping N-type impurity into a part of the P-type polysilicon formed in the peripheral region.

20. The method of claim 19, wherein the peripheral region is divided into an NMOS region and a PMOS region, and the cell region is an NMOS region, the N-type impurity being doped into the P-type polysilicon of the NMOS region.

21. The method of claim 20, wherein the P-type impurity is boron and the N-type impurity is phosphorous.

22. The method of claim 21, wherein a concentration of the boron ranges from approximately $10^{19}$ atoms/cm$^3$ to approximately $10^{21}$ atoms/cm$^3$.

23. The method of claim 19, wherein the P-type polysilicon is formed to a thickness ranging from approximately 500 Å to approximately 1,500 Å.

* * * * *